US012724456B2

(12) United States Patent
Saini et al.

(10) Patent No.: US 12,724,456 B2
(45) Date of Patent: Sep. 1, 2026

(54) BATTERY PROTECTION MECHANISMS

(71) Applicant: Google LLC, Mountain View, CA (US)

(72) Inventors: Vivek Saini, Sunnyvale, CA (US); Harrison Tung, Zhubei (TW); Chihmin Chien, Taipei City (TW); Amy Lai Wong, Newark, CA (US); Valentin Shaun de la Fuente, San Francisco, CA (US); Juan Manuel Fantin, Mountain View, CA (US); David F. Chang, Los Altos, CA (US); Prashant Bhogilal Patel, San Jose, CA (US); Bengt Gunnar Brummer, San Francisco, CA (US); Jason Stanley Pi, Fremont, CA (US)

(73) Assignee: Google LLC, Mountain View, CA (US)

(*) Notice: Subject to any disclaimer, the term of this patent is extended or adjusted under 35 U.S.C. 154(b) by 0 days.

(21) Appl. No.: 18/863,959

(22) PCT Filed: Apr. 28, 2023

(86) PCT No.: PCT/US2023/020367

§ 371 (c)(1),
(2) Date: Nov. 7, 2024

(87) PCT Pub. No.: WO2023/219815

PCT Pub. Date: Nov. 16, 2023

(65) Prior Publication Data

US 2025/0306634 A1 Oct. 2, 2025

Related U.S. Application Data

(60) Provisional application No. 63/364,479, filed on May 10, 2022.

(51) Int. Cl.
*G06F 1/16* (2006.01)
*G01L 1/22* (2006.01)
(Continued)

(52) U.S. Cl.
CPC .......... *G06F 1/1635* (2013.01); *G01L 1/2206* (2013.01); *G01L 1/2287* (2013.01);
(Continued)

(58) Field of Classification Search
None
See application file for complete search history.

(56) References Cited

U.S. PATENT DOCUMENTS 9,225,377 B1 * 12/2015 Hart .................... H04B 1/3888
9,774,135 B2 * 9/2017 Laine ........................ G06F 1/26
(Continued)

FOREIGN PATENT DOCUMENTS

EP 2 884 618 6/2015
EP 3 151 370 4/2017
(Continued)

OTHER PUBLICATIONS

International Search Report and Written Opinion for PCT/US2023/020367 mailed Aug. 11, 2023, 15 pages.
(Continued)

*Primary Examiner* — Xanthia C Relford
*Assistant Examiner* — Xanthia C Cunningham
(74) *Attorney, Agent, or Firm* — Lerner David LLP

(57) ABSTRACT

Various arrangements are presented for an electronic device having a battery housing and a tablet computer system having an electronic device having a battery housing. An electronic device may include an electronic display and an enclosure housing the electronic display. The electronic device may include one or more batteries that provide power to one or more components of the electronic device. The electronic device includes a first plurality of magnets. The first plurality of magnets is arranged to magnetically couple with a second plurality of magnets of a dock. The battery housing that houses the one or more batteries and separates
(Continued)

the one or more batteries from the first plurality of magnets. The battery housing defines one or more apertures and the first plurality of magnets is positioned with the one or more apertures.

20 Claims, 11 Drawing Sheets

(51) Int. Cl.

| | |
|---|---|
| ***H01M 50/242*** | (2021.01) |
| ***H01M 50/247*** | (2021.01) |
| ***H01M 50/262*** | (2021.01) |
| ***H01M 50/293*** | (2021.01) |
| ***H01R 13/24*** | (2006.01) |
| ***H04R 1/02*** | (2006.01) |
| ***H05K 5/02*** | (2006.01) |

(52) U.S. Cl.

CPC .......... *G06F 1/1626* (2013.01); *G06F 1/1632* (2013.01); *G06F 1/166* (2013.01); *H01M 50/242* (2021.01); *H01M 50/247* (2021.01); *H01M 50/262* (2021.01); *H01M 50/293* (2021.01); *H01R 13/2421* (2013.01); *H04R 1/028* (2013.01); *H05K 5/0204* (2013.01); *H01M 2220/30* (2013.01)

(56) References Cited

U.S. PATENT DOCUMENTS

| | | | | |
|---|---|---|---|---|
| 9,847,805 | B2 * | 12/2017 | Sirichai | G06F 1/182 |
| 10,754,393 | B2 * | 8/2020 | Campbell | G06F 1/1681 |
| 10,955,875 | B2 * | 3/2021 | Zhu | H01R 13/6633 |
| 11,137,797 | B2 * | 10/2021 | Claudepierre | H04M 1/0254 |
| 11,435,786 | B2 * | 9/2022 | Pelissier | G06F 1/1641 |
| 11,567,542 | B2 * | 1/2023 | Miller | F16C 11/04 |
| 12,001,240 | B2 * | 6/2024 | Parsian | H01R 13/6272 |
| 12,149,093 | B2 * | 11/2024 | Qiu | H01F 38/14 |
| 2010/0081473 | A1 | 4/2010 | Chatterjee et al. | |
| 2015/0162767 | A1 | 6/2015 | Oh et al. | |
| 2016/0239053 | A1 * | 8/2016 | Kiple | G06F 1/1679 |
| 2017/0068286 | A1 * | 3/2017 | Esmaeili | G06F 1/1669 |
| 2018/0032104 | A1 * | 2/2018 | Schatz | G06F 1/1683 |
| 2021/0026409 | A1 | 1/2021 | Miles et al. | |

FOREIGN PATENT DOCUMENTS

| | | | |
|---|---|---|---|
| JP | 2000323110 | A | 11/2000 |
| JP | 2015080205 | A | 4/2015 |
| JP | 2015111427 | A | 6/2015 |
| WO | 2012106215 | A2 | 8/2012 |
| WO | 2017/072163 | A1 | 5/2017 |
| WO | 2022066175 | A1 | 3/2022 |
| WO | 2023/219815 | A1 | 11/2023 |

OTHER PUBLICATIONS

Office Action for European Patent Application No. 23725054.3 dated Feb. 11, 2026. 8 pages.

Office Action for European Patent Application No. 23730248.4 dated Feb. 12, 2026. 8 pages.

Office Action for Japanese Patent Application No. 2024-566393 dated Apr. 14, 2026. 2 pages.

Office Action for Japanese Patent Application No. 2024-566378 dated Jun. 2, 2026. 4 pages.

* cited by examiner

BATTERY PROTECTION MECHANISMS

CROSS-REFERENCE TO RELATED APPLICATIONS

This application is a 371 National Stage filing of PCT Patent Application No. PCT/US2023/020367, filed Apr. 28, 2023, and titled "BATTERY PROTECTION MECHANISMS," which claims the benefit of U.S. Provisional Patent Application No. 63/364,479, entitled "DOCKABLE AND UNDOCKABLE MULTI-PURPOSE ELECTRONIC TABLET DEVICE," filed May 10, 2022, the entire disclosures of which are incorporated by reference herein for all purposes.

BACKGROUND

Tablet computing devices, sometimes referred to as tablets or as tablet computers, are generally planar, lightweight devices that include a touch-screen display. Tablets are battery powered and can be plugged in to recharge the tablet's battery.

SUMMARY

Various embodiments are described related to an electronic device having a battery housing having magnets positioned within apertures of the battery housing and isolated from batteries housed by the battery housing. In some embodiments, a tablet computer system including a tablet computer having a battery housing is described. The electronic device may comprise an electronic display and an enclosure housing the electronic display. The electronic device may further include one or more batteries that provide power to one or more components of the electronic device. The electronic device may include a first plurality of magnets. The first plurality of magnets is arranged to magnetically couple with a second plurality of magnets of a dock. The battery housing houses the one or more batteries, and the battery housing separates the one or more batteries from the first plurality of magnets. The battery housing defines one or more apertures, and the first plurality of magnets is positioned with the one or more apertures.

Embodiments of such an electronic device may comprise one or more of the following features: the one or more batteries may extend across the battery housing, including the one or more apertures. An intermediate layer may extend between the one or more batteries and the one or more apertures. The intermediate layer may extend beyond edges of the one or more apertures. The intermediate layer may comprise mylar. The intermediate layer may extend across the first plurality of magnets positioned within the one or more apertures. In various embodiments, each of the first plurality of magnets are grouped into pairs. In further embodiments, the electronic device includes a plurality of electrical contacts that are arranged to transfer electrical signals between the dock and the electronic device, when the electronic device is magnetically docked with the dock. The plurality of electrical contacts comprises one or more pogo pins. In some embodiments, the battery housing is coupled to the enclosure using an adhesive. The battery housing may further include one or more clips for managing cables internal to the enclosure and one or more screw bosses for facilitating alignment of the battery housing.

In various embodiments, a tablet computer system comprises a dock and a tablet computer which can be removably docked from the dock. The tablet computer includes an electronic display and an enclosure housing the electronic display. The tablet computer may further include one or more batteries that provide power to one or more components of the electronic device and a first plurality of magnets. The first plurality of magnets is arranged to magnetically couple with a second plurality of magnets of the dock. The tablet computer includes a battery housing that houses the one or more batteries. The battery housing defines one or more apertures, and the first plurality of magnets are positioned with the one or more apertures. The battery housing includes an intermediate layer extending between the one or more batteries and the one or more apertures. In some embodiments, the battery housing is formed from a first portion and a second portion, the first portion and the second portion being separated by a central channel. In at least some embodiments, the tablet computer system includes a first set of electronic wires, and the central channel is configured to house the first set of electronic wires along a first side of the central channel. In at least some embodiments, the tablet computer system includes a second set of electronic wires associated with the touchscreen display, wherein the central channel is configured to house the second set of electronic wires along a second side of the central channel.

Embodiments of such a tablet computer system may comprise one or more of the following features: the one or more batteries may extend across the battery housing, including the one or more apertures. The intermediate layer may comprise mylar. The one or more batteries are coupled to the battery housing using an adhesive. The battery housing may further include one or more clips for managing cables internal to the enclosure and one or more screw bosses for facilitating alignment of the battery housing.

BRIEF DESCRIPTION OF THE DRAWINGS

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
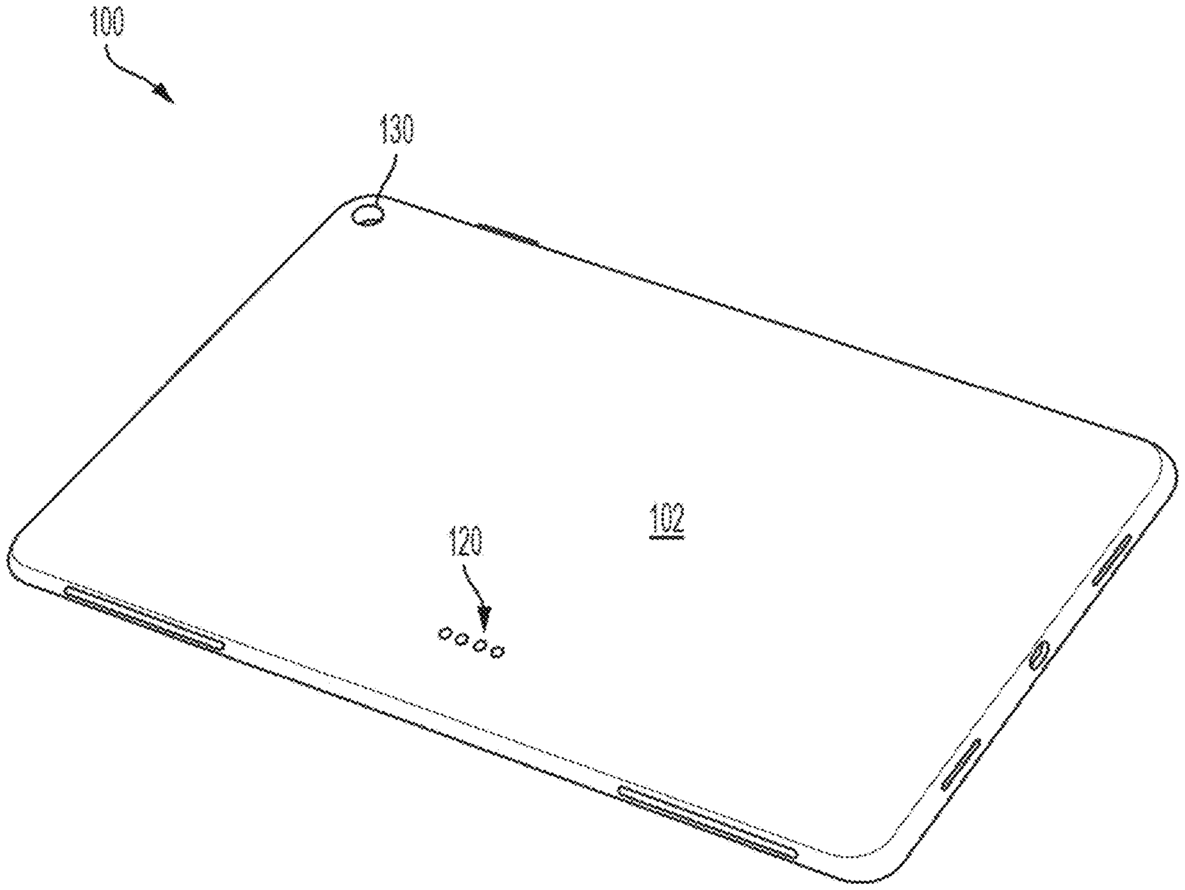
FIG. 1 illustrates an embodiment of a device that can be docked with a docking station or "dock" using magnets, according to some implementations of the present disclosure.

Various embodiments are described related to an electronic device. The electronic device may comprise an electronic display. The electronic device may include one or more batteries that provide power to one or more components of the electronic device. The electronic device may further comprise a first set of magnets. The first set of magnets are arranged to magnetically couple with a second set of magnets of a dock. The electronic device may include electrical contacts that may be arranged to transfer electrical signals between the dock and the electronic device when the electronic device may be magnetically docked with the dock. In some embodiments, a tablet computer system is described. The system may include a tablet computer and a dock with which the tablet computer can be removably docked. The tablet computer may include an electronic display.

Magnets may be used to couple and align a tablet to a charging dock. The arrangement of batteries and magnets within a tablet must be carefully considered such that the batteries and magnets to optimize spacing and design constraints in electronic devices. Magnets can be used for coupling two devices, such as coupling a tablet computer and a dock as detailed herein. The attractive force between magnets in the tablet and dock may need to be strong enough to couple the electronic device to the dock and to prevent unwanted decoupling when the electronic device is accidentally hit. Electronic devices can include rechargeable batteries which recharge when the electronic device is coupled to the dock. Batteries are at risk for damage when the electronic device is dropped, hit, bent, or otherwise impacted due to misuse. For example, an impact could potentially cause a corner of a magnet to pierce or otherwise damage a battery. Accordingly, there is a need in the art for an arrangement of batteries and magnets within electronic devices which protects the batteries upon impact.

When the tablet is mounted to the dock, a first plurality of magnets that are included within the electronic device can magnetically couple with a second plurality of magnets present in the dock. The magnets can function to not only hold the device in position on the dock, but also cause multiple contact pads of the device to align with contact pins of the dock. The contact pads allow for electrical signals, which can include data, power, or both, to be exchanged between the dock and device.

The embodiments detailed herein are focused on an electronic device having a battery housing defining one or more apertures. In various embodiments, magnets are located within the apertures and are separated from the batteries housed by the battery housing. While the battery housing provides protection to the batteries of the electronic device from impact, the magnets being located within apertures in the battery housing allows for the electronic device to have a reduced thickness compared to if the magnets were located outside of the battery housing. In some embodiments, the electronic device is a tablet computer that is a component of a tablet computer system. Specifically, a tablet computer can serve as a home assistant device and/or hub to manage smart home devices in an environment. The tablet computer may be able to record video, communicate with a remote server system, and interact with users via spoken communications. For example, a home assistant device may provide automated control or voice control of devices, appliances, and systems, such as heating, ventilation, and air conditioning ("HVAC") system, lighting systems, home theater, entertainment systems, as well as security systems. Smart home networks may include control panels that a person may use to input settings, preferences, and scheduling information that the smart home network uses to provide automated control of the various devices, appliances, and systems in the home. For example, the person may input a schedule indicating when the person is away from the home, and the smart home network uses this information along with information obtained from various devices in the home to detect unauthorized entry when the user is away. The tablet computer may be left docked with a dock to charge its battery and use other features of the dock, such as an integrated speaker. The tablet computer may be removed from the dock for convenience to be used or displayed at another location. When not in use (whether docked, not docked, or both), photos or photo albums selected by a user may be presented by the tablet.

Many other types of electronic devices can benefit from battery housing which safely and efficiently arranges batteries and magnets within an electronic device. For example, smartphones, gaming devices, e-readers, personal digital assistants (PDAs), digital paper tablets, and smart picture frames may benefit from various embodiments of a battery housing as detailed herein. Furthermore, the electronic device may an assistant device (e.g., Google® Nest® Hub; Google® Nest® Hub Max); a home automation controller (e.g., controller for an alarm system, thermostat, lighting system, door lock, motorized doors, etc.); a gaming device (e.g., a gaming system, gaming controller, data glove, etc.); a communication device (e.g., a smart phone such as a Google® Pixel® Phone, cellular phone, mobile phone, wireless phone, portable phone, radio telephone, etc.); and/or other computing device (e.g., a tablet computer, phablet computer, notebook computer, laptop computer, etc.).

Further detail is provided in reference to the figures. FIG. 1 illustrates an embodiment of an electronic device 100 that is configured to dock with a dock using magnets and, in some embodiments, contact pads. The electronic device 100 can be a tablet computer or, more specifically, a tablet computer that serves as a home assistant device or hub as previously detailed. One or more magnets may be hidden within the electronic device 100 behind rear surface 102. Device 100 includes multiple conductive contact pads 120 (e.g., metallic pads) that are used to transfer data with and/or obtain power from a dock when the device 100 is in a docked position. As illustrated, four contact pads 120 are present. In other embodiments, a greater or fewer number of contact pads 120 may be present. The arrangement of contact pads 120 can also vary by embodiment. In other embodiments, rather than using contact pads, some other form of electrical contact may be used, such as pins or a combination of pads and pins. Other components, such as camera 130, may be present on or accessible through rear surface 102.

Figure 2:
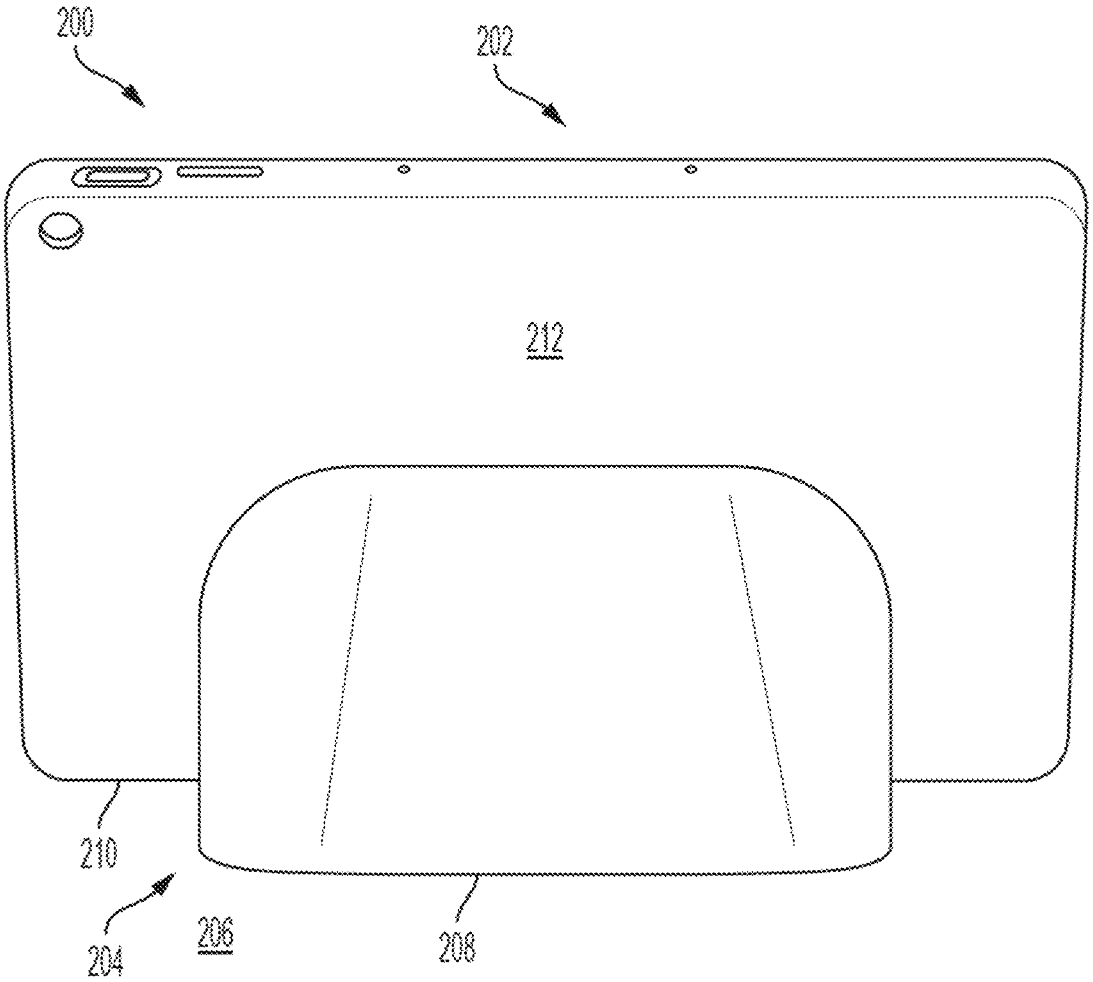
FIG. 2 illustrates a rear view of an embodiment of a device that is magnetically docked with a dock, according to some implementations of the present disclosure.

FIG. 2 illustrates a rear view of an embodiment of a system 200 that includes an electronic device 202 docked with a dock 204. The dock 204 connects with the electronic device 202 via one or more magnets of dock 204 that magnetically connect corresponding magnets of the electronic device 202. When coupled, the electronic device 202 can be suspended off of surface 206, upon which a base 208 of the dock 204 rests. Accordingly, edge 210 may not touch surface 206 when the electronic device 202 is docked with the dock 204.

The dock 204 magnetically couples with the electronic device 202 within the region of rear surface 212. Since the connection is magnetic, a user may pull the electronic device 202 away from the dock 204 to remove. To mate, the user may move the electronic device 202 close to the dock 204. Once close, the magnets of the electronic device 202 and magnets of the dock 204 help guide the electronic device 202 into the proper alignment on the dock 204. When docked, contact pads (such as contact pads 120 in FIG. 1) make contact with corresponding pins (or another form of electrical contact) present on the mating surface of the dock 204.

In some embodiments, one or more electromagnets may be present within the dock 204 that can be engaged or disengaged. When engaged, such magnets may prevent the electronic device 202 from being easily removed by a user from the dock 204. When disengaged, it may be relatively easy (compared to when engaged) for the user to the electronic device 202 from the dock 204.

Figure 3:
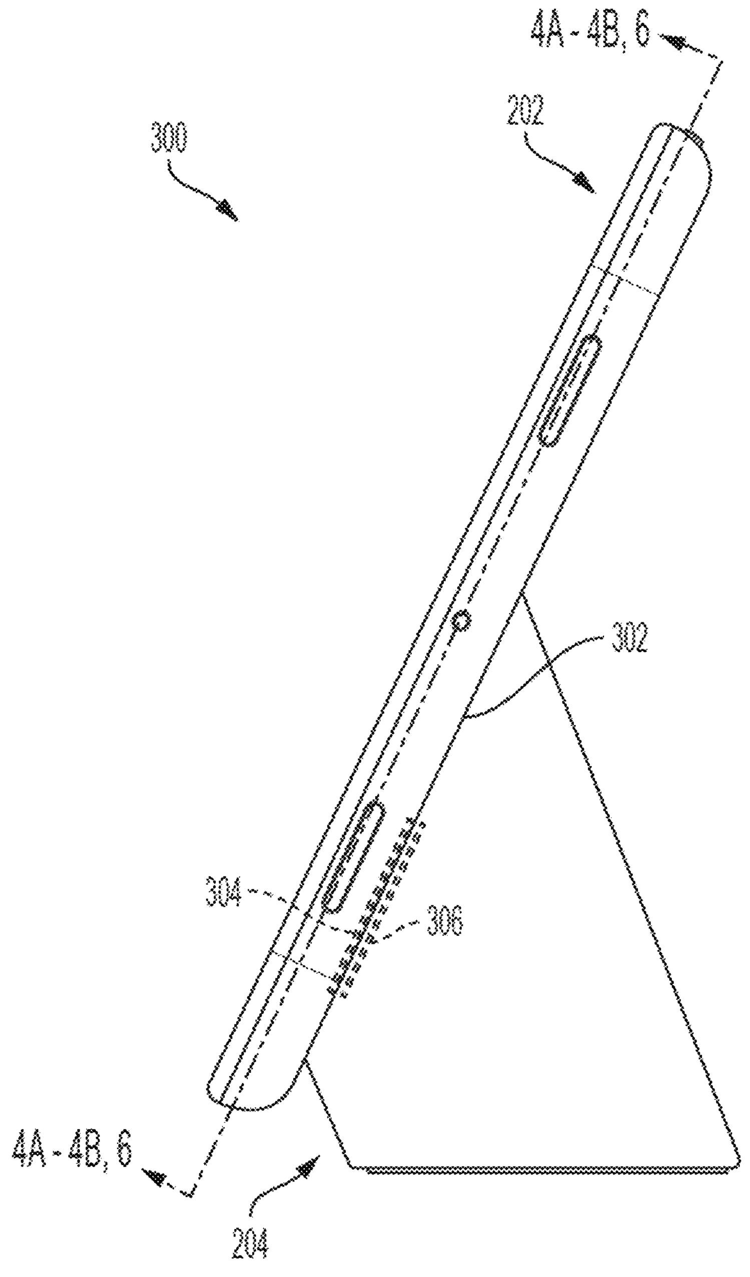
FIG. 3 illustrates a side view of an embodiment of a device that is magnetically docked with a dock, according to some implementations of the present disclosure.

FIG. 3 illustrates a side view of a system 300 that includes an embodiment of an electronic device. As can be seen from the side view, the electronic device 202 is docked with dock 204. Mating surface 302 indicates where the rear surface 212 of the electronic device 202 contacts the dock 204.

Within region 304, a first plurality of magnets is present within the electronic device 202. In corresponding locations within region 306, a second plurality of magnets is present within the dock 204. The magnets are arranged such that, when brought into proximity, the magnets of the electronic device 202 attract to the magnets of the dock 204 to help correctly position and align the dock 204 against the electronic device 202 and hold the electronic device 202 in a correct position on the dock 204. In other aspects, regions 304 and 306 may extend further upward on the dock 204 and/or extend the length of the dock 204 which contacts the electronic device 400. For example, regions 304 and 306 may be any size and located at any location on the electronic device 400 and/or the dock 204.

Figure 4A:
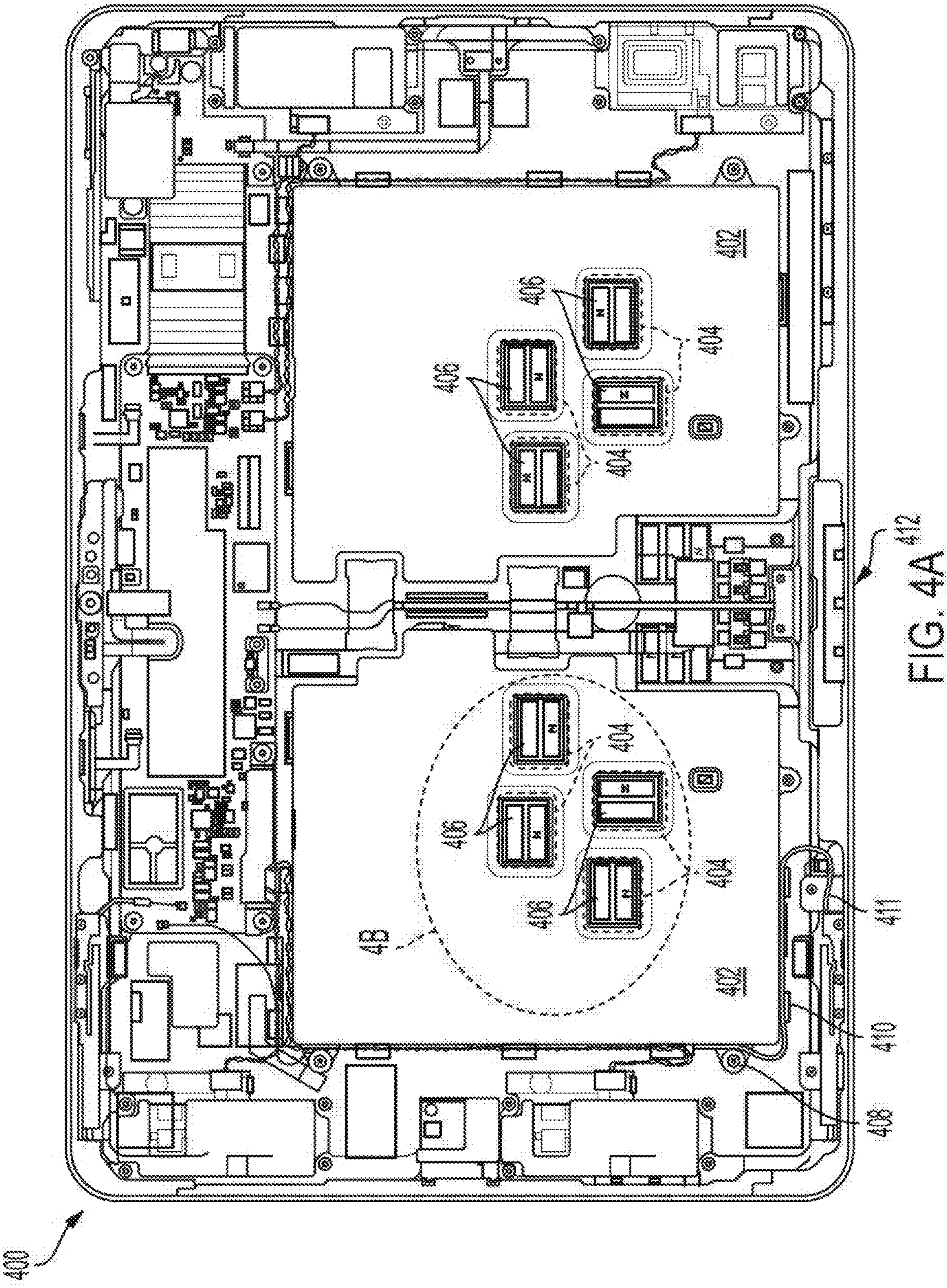
FIG. 4A illustrates a cross-sectional view of an embodiment of a device in which the location of magnets and a battery housing are denoted, according to some implementations of the present disclosure.

FIG. 4A illustrates a rear cross-sectional view of an electronic device 400. Electronic device 400 may be a tablet computer that is configured to dock with a dock using magnets. In particular, the electronic device 400 may be a smart home assistant device as previously detailed. The electronic device 400 includes a battery housing 402 that houses the one or more batteries (not shown) that provide power to one or more components of the electronic device 400. The battery housing 402 may comprise a plastic or otherwise insulating material. The battery housing 402 preferably defines a substantially flat surface for mounting and housing the one or more batteries. The battery housing 402 defines one or more apertures 404. The electronic device 400 comprises a first plurality of magnets 406 which are located within the one or more apertures 404.

In various aspects, the one or more batteries extend across the battery housing 402, including the one or more apertures 404. For example, the electronic device 400 includes at least two batteries, each battery extending across half of the battery housing 402.

The first plurality of magnets 406 are arranged to magnetically couple with a second plurality of magnets of a dock. In various embodiments, the first plurality of magnets 406 are grouped (e.g., arranged) in pairs, as shown. For example, the pairs of magnets in the first plurality of magnets 406 have opposed north and south orientations in-plane with respect to a surface of the electronic device 400. Such an arrangement of opposing poles may concentrate the magnetic field for facilitating alignment of the electronic device 400 when docked to a dock. In other embodiments, the first plurality of magnets 406 are arranged in trios. The pairs of the first plurality of magnets 406 may have a polarity such that they magnetically attract corresponding magnets in a dock. For example, a magnet in the first plurality of magnets 406 is oriented within the electronic device 400 such that a corresponding magnet in the dock has the opposite polarity of the magnet in the first plurality of magnets 406. Such an arrangement allows the first plurality of magnets 406 in the electronic device 400 to be attracted to a second plurality of magnets of the dock. The arrangement and number of the first plurality of magnets 406 may vary. For example, the electronic device 400 shows 16 magnets in the first plurality of magnets 406. Accordingly, a second plurality of magnets may include 16 magnets corresponding to the first plurality of magnets 406. In other embodiments, any number of magnets may be located within an aperture.

For example, one magnet, three magnets, two pairs of magnets, etc., may be located within an aperture. In yet another example, the number of magnets within an aperture may vary (e.g., one magnet within one aperture and two magnets in a second aperture, etc.).

In various aspects, the battery housing 402 includes one or more screw bosses 408. The one or more screw bosses 408 may be disposed along a perimeter of the battery housing 402. The one or more screw bosses 408 facilitate alignment of the battery housing 402 within the electronic device 400. The one or more screw bosses 408 further secure the battery housing 402 within the electronic device 400. The one or more screw bosses 408 within a housing of the electronic device 400 may be used to align and secure the battery housing 402 to an enclosure of the electronic device 400.

Advantageously, the one or more screw bosses 408 allow the battery housing 402, and the corresponding one or more batteries, to be easily removed and replaced by a user. For example, a user may experience difficulties in replacing batteries in conventional electronic device systems which do not include these additional alignment and securement features. Furthermore, conventional electronic devices do not include a battery housing, and, rather, one or more batteries are adhered to an enclosure of the electronic device during manufacturing. In contrast, the battery housing 402 provided herein simplifies the alignment of replacement batteries and enables reworkability of the interior components of the electronic device 400. In particular, the battery housing 402 in combination with the screw bosses 408 enables serviceability of the batteries in the electronic device which otherwise would be limited to a skilled technician and/or require a complex template tool to properly align the batteries in the electronic device.

In further aspects, the battery housing 402 includes one or more clips 410. The one or more clips 410 may be disposed along the perimeter of the battery housing 402. The one or more clips may be used to manage cables 411, or other wiring, which are internal to the electronic device 400. The clips 410 provide additional space management within the electronic device 400, thereby enabling a smaller layout of the components, if desired. The clips 410 also facilitate serviceability of the internal components of the electronic device where a user can visualize where the wiring goes before and after replacing the batteries or other components.

In various aspects, the electronic device 400 further includes a plurality of electrical contacts in a pin block 412 that are arranged to transfer electrical signals between the dock and the electronic device 400 when the electronic device 400 is magnetically docked with the dock. The pin block 412 can include one or more pins, such as spring-loaded pins (e.g., pogo pins) that electrically contact electrical pads or contact on an installed device. In one embodiment, 4 pogo pins are arranged in the pin block 412, although more or less may be used in various designs. The pin block 412 also includes corresponding electrical pads or contacts that make electrical contact with corresponding contacts or pads of a dock, when docked. Therefore, the pin block 412 serves as an electrical pass-through between a device and dock for electrical signals which can include data and/or power. In other embodiments, no electrical contacts may be present, or some other form of electrical contact other than pads and pins may be used.

Figure 4B:
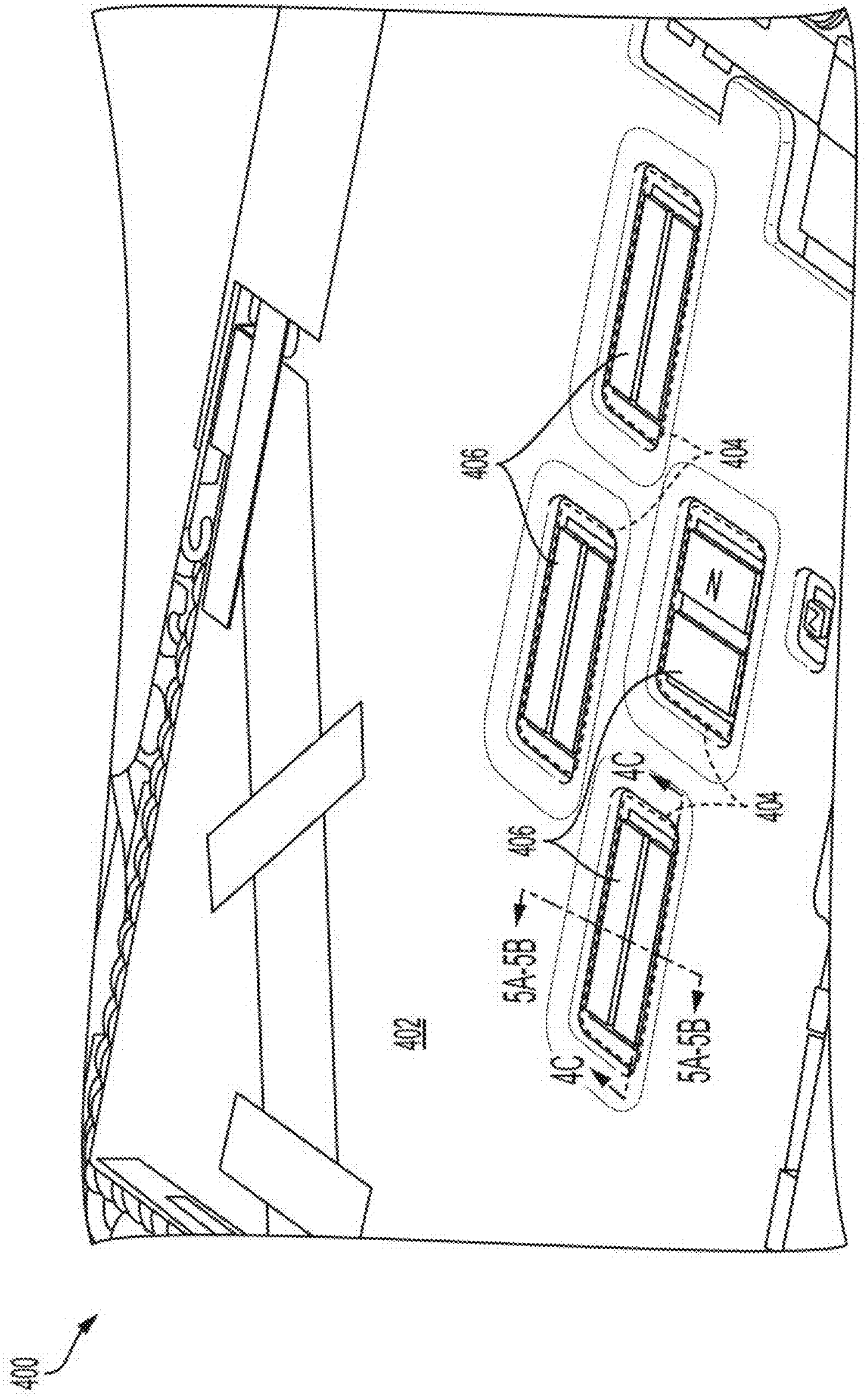
FIG. 4B illustrates a cross-sectional perspective view of an embodiment of a device in which the locations of magnets and a battery housing are denoted, according to some implementations of the present disclosure.

FIG. 4B depicts an inset of the cross-sectional view of the electronic device 400 including the first plurality of magnets 406 and the battery housing 402 defining one or more corresponding apertures 404. As shown, each pair of the first plurality of magnets 406 are located within a corresponding aperture 404, although individual magnets of the first plurality of magnets 406 may are located within a corresponding aperture 404. Further depicted in FIG. 4B, a top surface of the each of the first plurality of magnets 406 are recessed below the surface of the battery housing 402. In other aspects, the first plurality of magnets 406 are level with the surface of the battery housing 402. In yet other aspects, the first plurality of magnets 406 are proud (e.g., raised) with respect to the surface of the battery housing 402.

Figure 4C:
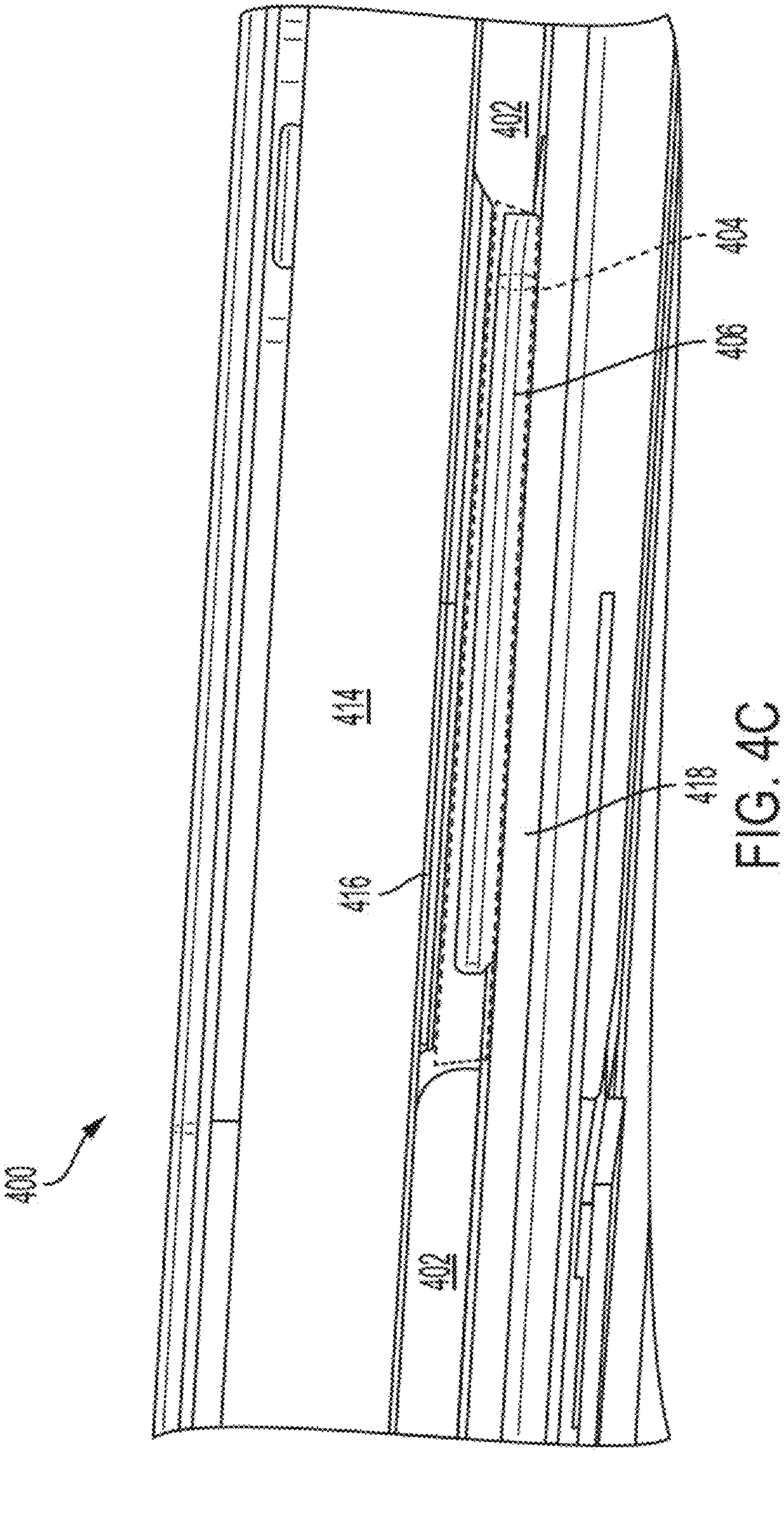
FIG. 4C illustrates a cross-sectional perspective view of an embodiment of a device in which the locations of magnets and a battery housing are denoted, according to some implementations of the present disclosure.

FIG. 4C depicts a cross-section of the electronic device 400 including a battery 414 disposed and extending across a battery housing 402. A magnet of the first plurality of magnets 406 extends through an aperture 404 defined by the battery housing 402.

As shown in FIG. 4C, the electronic device 400 includes an intermediate layer 416 that extends between the battery 414 and the aperture 404. The intermediate layer 416 also extends between the battery 414 and the magnet of the first plurality of magnets 406 disposed on an enclosure 418 of the electronic device. In various aspects, the intermediate layer 416 comprises mylar. In various aspects, the intermediate layer 416 separates the one or more batteries 414 from the first plurality of magnets 406. In various aspects, the intermediate layer 416 insulates the one or more batteries 414 from the first plurality of magnets 406 such the performance of each of the batteries and the magnets is not affected by the other (e.g., the batteries do not interfere with the magnets and vice versa). The intermediate layer 416 may also physically separate the one or more batteries 414 from the first plurality of magnets 406. Furthermore, the intermediate layer 416 provides additional protection to the one or more batteries 414 and/or the first plurality of magnets 406 in the case of an impact. For example, a mylar-including intermediate layer 416 was shown to significantly reduce damage to the battery and the magnets during drop tests. The intermediate layer 416 further prevents piercing of the batteries during impacts or drops.

Advantageously, the battery housing 402 separates the battery 414 and the first plurality of magnets 406. Separating the battery 414 from the first plurality of magnets 406 may include physically separation (e.g., mechanically isolation via an air gap) and/or electrically insulating the battery 414 and the first plurality of magnets 406 such that these components may be arranged close together, in any desired arrangement. In stark contrast, conventional electronic device designs including magnets and batteries must space the magnets and batteries far enough away from each other to minimize any deleterious effects. Accordingly, conventional electronic devices require a much larger relative surface area to arrange the magnets and batteries and a corresponding dock must have a correspondingly large surface area to arrange its own corresponding magnets (e.g., such as the second plurality of magnets described herein). Accordingly, the battery housing 402 provided herein enables arrangements and geometries of batteries and magnets not previously available in electronic devices.

Figure 5A:
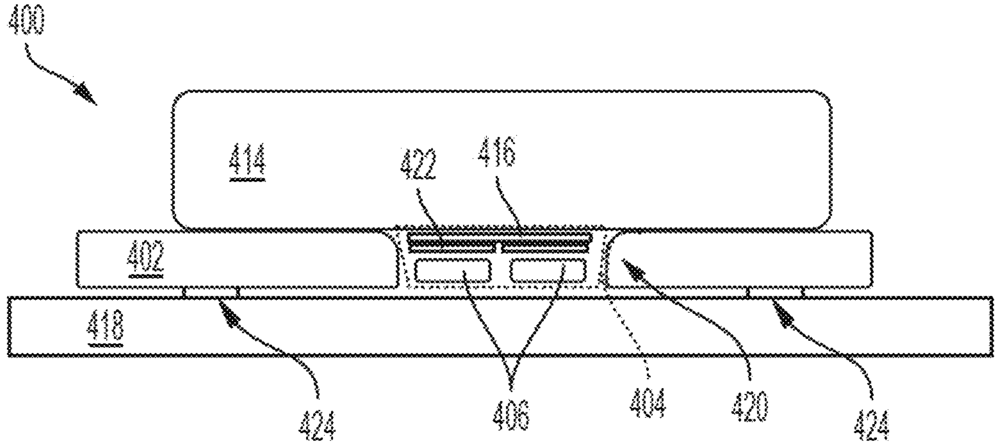
FIG. 5A illustrates a side cross-sectional view of an embodiment of a device, according to some implementations of the present disclosure.

Referring now to FIG. 5A, in some aspects, the intermediate layer 416 extends across each pair of the first plurality of magnets 406 positioned within the one or more apertures 404 and disposed on an enclosure 418 of the electronic device. For example, an intermediate layer 416 extends across a pair of magnets of the first plurality of magnets 406 within the one or more apertures but does not extend to the edges 420 of the one or more apertures 404.

In some aspects, as shown in FIG. 5A, a foam layer 422 may be positioned between the intermediate layer 416 and each of the first plurality of magnets 406 positioned within the one or more apertures 404. Further, in various aspects, as shown in FIG. 5A, the battery housing 402 is coupled to the enclosure 418 of the electronic device 400 using an adhesive 424, such as a pressure-sensitive adhesive (PSA).

Figure 5B:
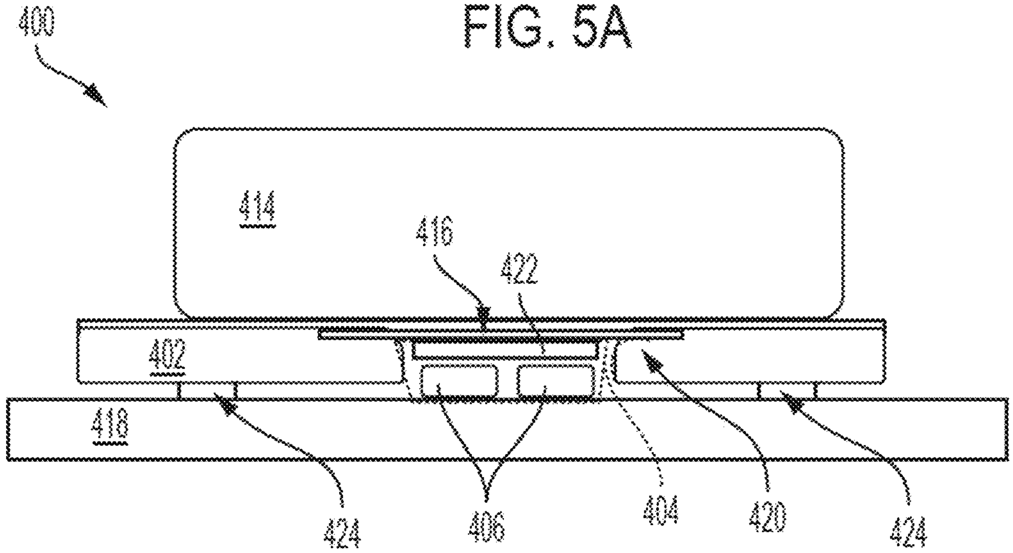
FIG. 5B illustrates a side cross-sectional view of an embodiment of a device, according to some implementations of the present disclosure.

Referring now to FIG. 5B, in other embodiments, the intermediate layer 416 extends across the first plurality of magnets 406 positioned within the one or more apertures 404 and disposed on an enclosure 418 of the electronic device 400. For example, an intermediate layer 416 extends beyond the edges 420 of the one or more apertures 404. A single foam layer 422 may be positioned between the intermediate layer 416 and each pair of the first plurality of magnets 406 positioned within the one or more apertures 404. Further, in various aspects, as shown in FIG. 5B, the battery housing 402 is coupled to the enclosure 418 of the electronic device 400 using an adhesive 424, such as a pressure-sensitive adhesive (PSA).

In another aspect, the intermediate layer 416 may be a single sheet that extends along the length of the battery housing 402, the length of the battery 414, or the length of both batteries 414 (e.g., where the electronic device 400 includes at least two batteries 414).

Figure 6:
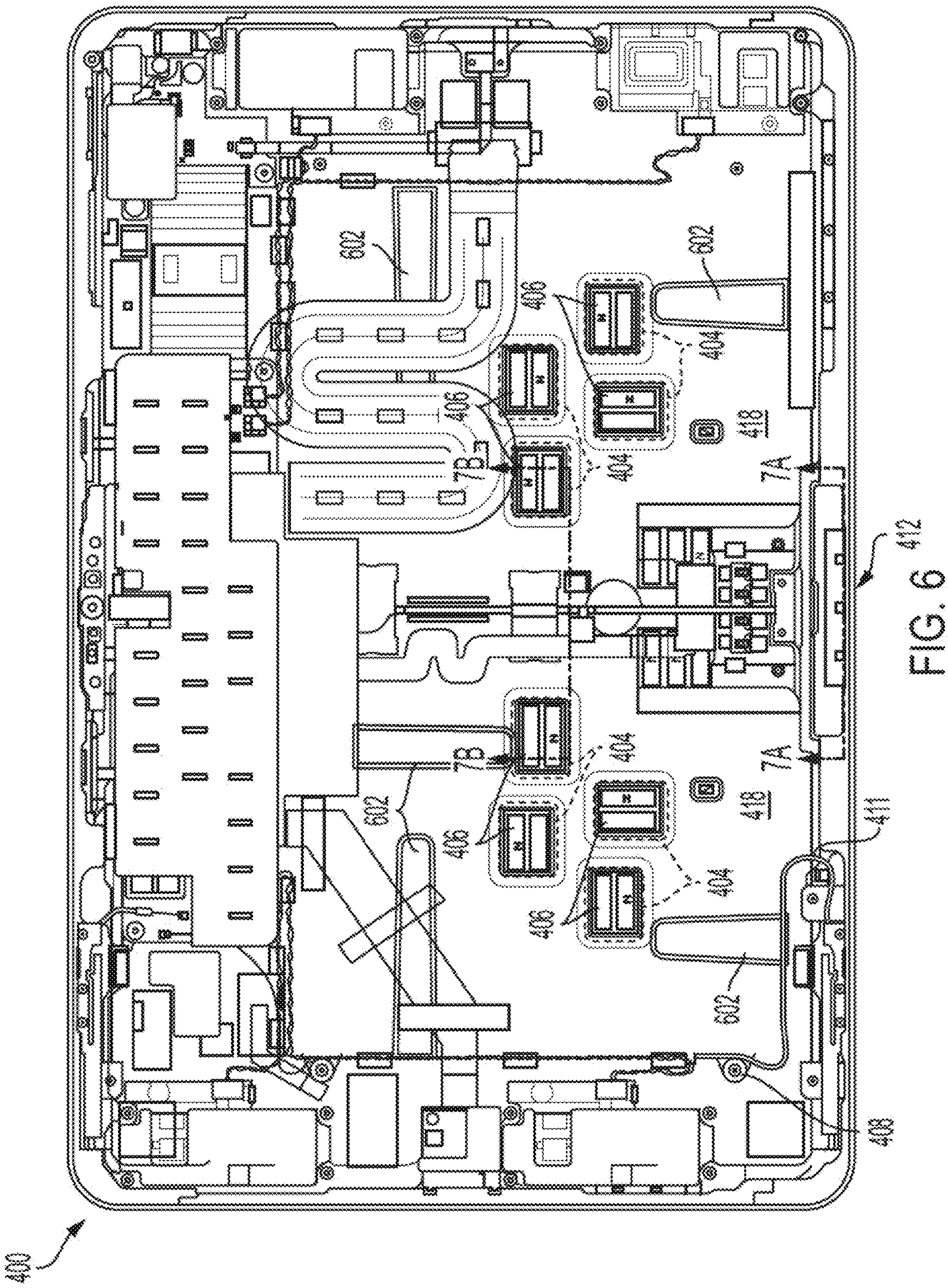
FIG. 6 illustrates a cross-sectional view of an embodiment of a device in which the locations of magnets are denoted, according to some implementations of the present disclosure.

FIG. 6 depicts a cross-sectional view of electronic device 400 having the battery housing (e.g., battery housing 402) removed. As shown, an adhesive 602 may be provided. The adhesive may be a tab, stretch release adhesive. In various aspects, the adhesive 602 may include any other adhesive known in the art. In some aspects, the adhesive 602 may couple the battery housing (e.g., battery housing 402) to the enclosure 418. In further aspects, the one or more batteries (e.g., one or more batteries 414) are coupled to the battery housing (e.g., battery housing 402) using the adhesive 602.

Figure 7A:
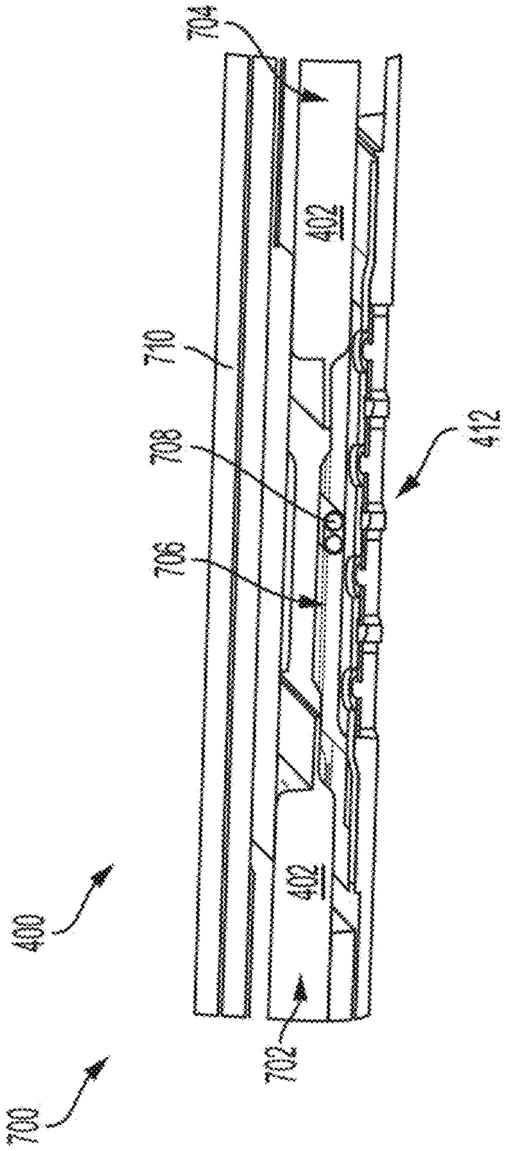
FIG. 7A illustrates a cross-sectional perspective view of an embodiment of a device, according to some implementations of the present disclosure.
Figure 7B:
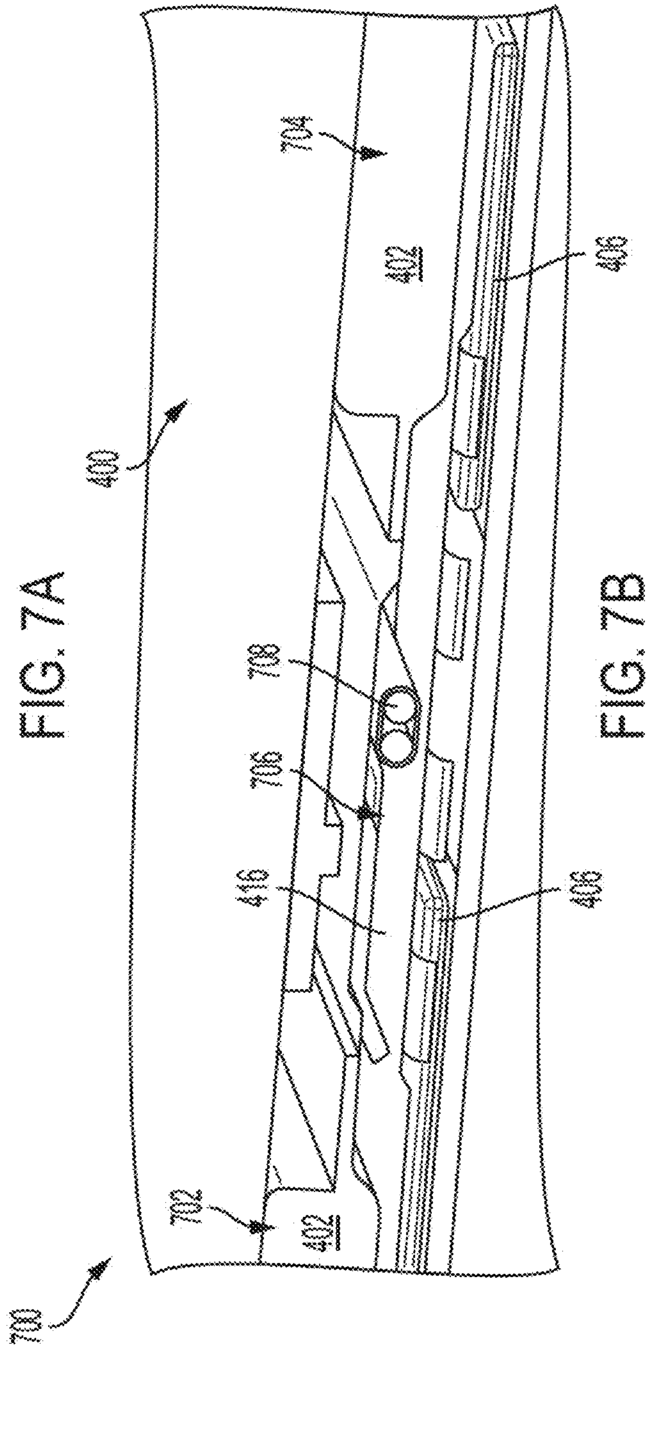
FIG. 7B illustrates a cross-sectional perspective view of an embodiment of a device, according to some implementations of the present disclosure.

FIGS. 7A-7B depict cross-sections 700 of an electronic device 400, in particular, a battery housing 402 of the electronic device 400. In various aspects, the battery housing 402 includes a first portion 702 and a second portion 704. Each of the first portion 702 and the second portion 704 may be associated with one of the one or more batteries. In various aspects, the battery housing 402 is configured to house a butterfly battery comprising two batteries. Accordingly, the battery housing 402 is configured to house each battery in the butterfly battery. The butterfly battery housed by the battery housing 402 defines a central channel 706 between the first portion 702 and the second portion 704 of the battery housing 402 and connects the first portion 702 and the second portion 704 of the battery housing 402. For example, a flexible material connects both batteries in a butterfly battery and defines a top surface of a central channel 706 between the two portions of the battery housing 402.

In various aspects, a first set of electronic wires 708 are located within the central channel 706. In one aspect, the central channel 706 is configured to house the first set of electronic wires 708 along a first side of the central channel 706. In various aspects, a second set of electronic wires (not shown) associated with a touchscreen display 710 of the electronic device 400 may also be located within the central channel 706. The second set of electronic wires may be located along a second side of the central channel 706, in some aspects. The first and/or second set of wires may include ultra-wideband (UWB) wires. In various embodiments, the space provided by the central channel 706 enables efficient cable management for any wiring within the electronic device.

Figure 8:
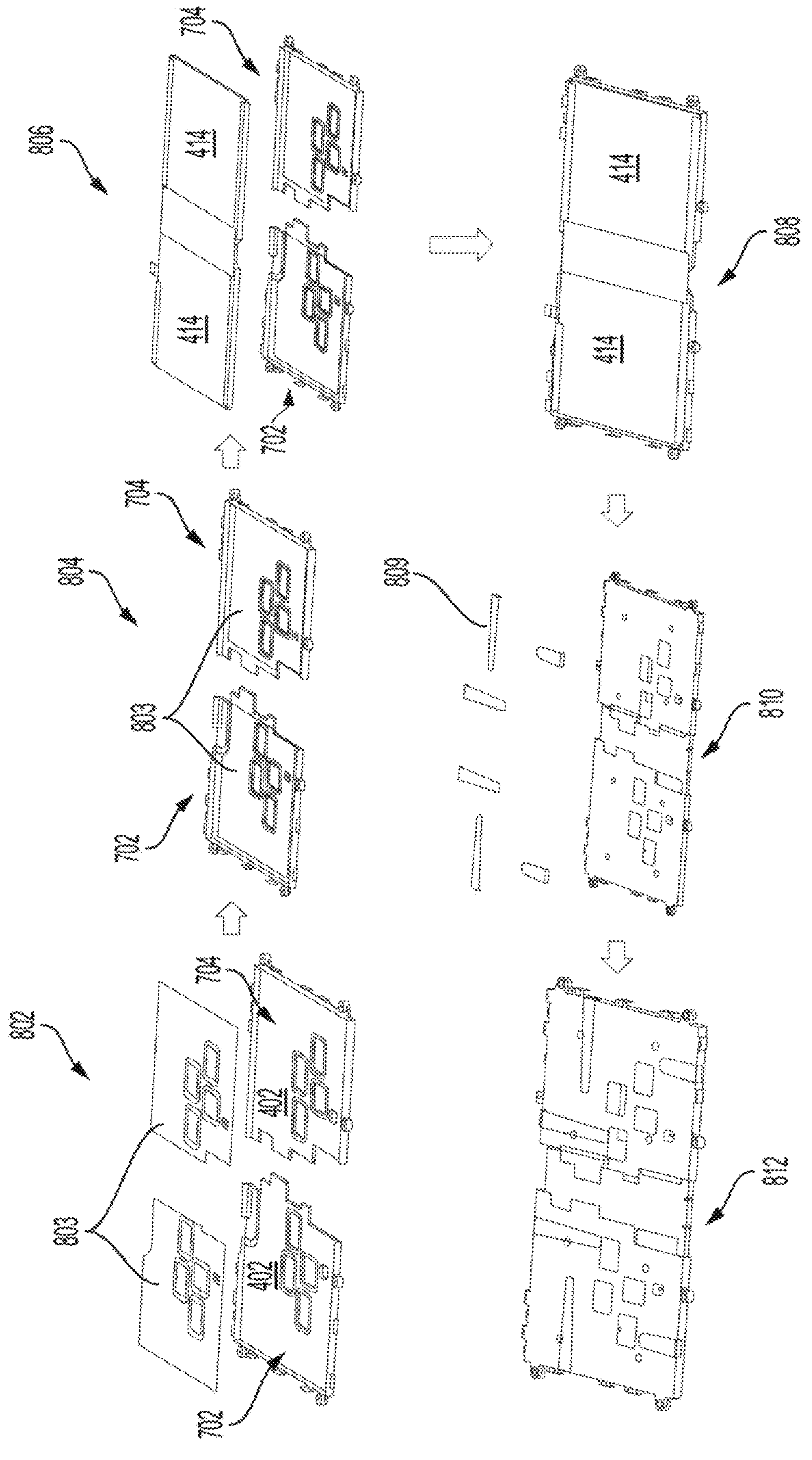
FIG. 8 illustrates a flowchart of a process, according to some implementations of the present disclosure.

FIG. 8 illustrates a flowchart of an example process 800 of servicing a battery in an electronic device. The process 800 may be implemented to manufacturing and/or servicing (e.g., replacing components) an electronic device such as electronic device 400 described in detail above.

At block 802, an intermediate layer 803 (e.g., such as a mylar layer described in detail above) may be applied to each of a first portion 702 of a battery housing 402 and a second portion 704 of a battery housing 402, resulting in block 804.

At block 806, a protective layer (not shown) may be removed from the adhesive and each battery 414 in a butterfly battery is adhered to the respective first portion 702 of a battery housing 402 and a second portion 704 of a battery housing 402, resulting in block 808. As shown, the butterfly battery includes two batteries 414 connected by a flexible material which defines a separation between the first portion 702 of the battery housing 402 and the second portion 704 of the battery housing 402, resulting in block 808.

At block 810, adhesive tabs 809 are applied to the opposite side of the first portion 702 of a battery housing 402 and the second portion 704 of the battery housing 402, resulting in block 812. The adhesive tabs 809 may couple the battery housing 402 to the enclosure of the electronic device in at least some aspects. In further aspects, the one or more batteries (e.g., one or more batteries 414) are coupled to the battery housing (e.g., battery housing 402) using the adhesive tabs 809.

Figure 9:
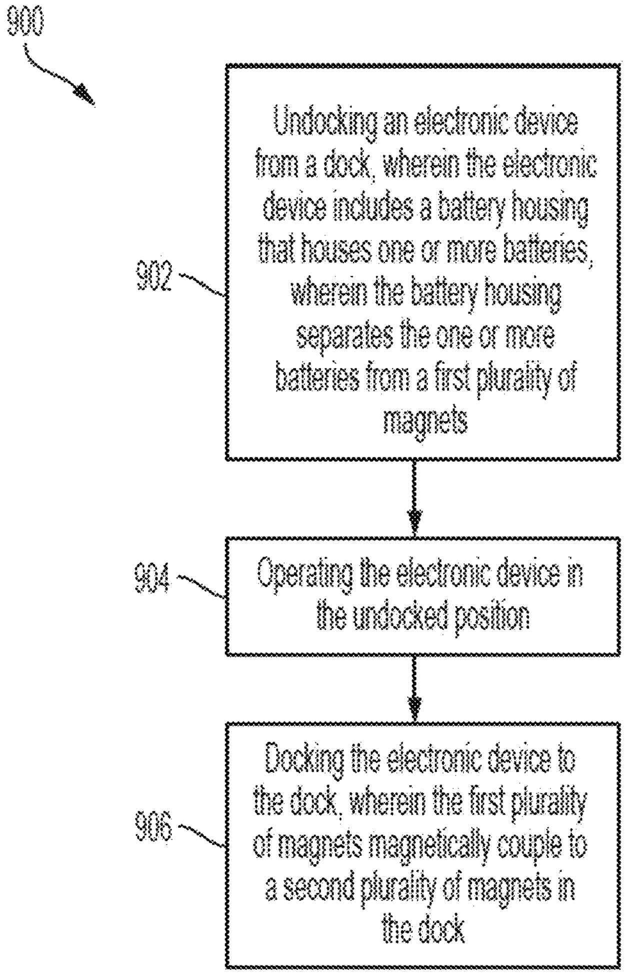
FIG. 9 illustrates a flowchart of a method, according to some implementations of the present disclosure.

Referring now to FIG. 9, a flowchart of a method 900, according to various aspects of the present disclosure. Method 900 includes step 902 including undocking an electronic device from a dock. The electronic device includes a battery housing that houses one or more batteries and the battery housing separates the one or more batteries from a first plurality of magnets, as described in detail above with respect to FIGS. 1-8.

Step 904 includes operating the electronic device in the undocked position. For example, the electronic device may be a tablet computer which is usable without the dock for any operations known in the art. In particular, the electronic device is a smart home assistant and operating the electronic device in the undocked position may include recording video, communicating with a remote server system, interacting with users via spoken communications, etc. In other examples, the electronic device may be used as a smartphone, a gaming device, an e-readers, etc.

Step 906 includes docking the electronic device to the dock. The first plurality of magnets magnetically couple to a second plurality of magnets in the dock. The first and second pluralities of magnets may be used to dock the electronic device to the dock according to any of the aspects described in detail above. The electronic device may be left docked with the dock to charge its battery and use other features of the dock, such as an integrated speaker. The electronic device may be removed from the dock for convenience to be used or displayed at another location. When not in use (whether docked, not docked, or both), photos or photo albums selected by a user may be presented by the tablet.

It should be noted that the methods, systems, and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

Specific details are given in the description to provide a thorough understanding of the embodiments. However, it will be understood by one of ordinary skill in the art that the embodiments may be practiced without these specific details. For example, well-known, processes, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing embodiments of the invention. Various changes may be made in the function and arrangement of elements without departing from the spirit and scope of the invention.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

What is claimed is:

1. An electronic device, comprising:

an electronic display;

an enclosure housing the electronic display;

one or more batteries that provide power to one or more components of the electronic device;

a first plurality of magnets, wherein the first plurality of magnets is arranged to magnetically couple with a second plurality of magnets of a dock; and a battery housing that houses the one or more batteries, wherein:

the battery housing separates the one or more batteries from the first plurality of magnets;

the battery housing defines one or more apertures; and the first plurality of magnets is positioned with the one or more apertures.

2. The electronic device of claim 1, wherein the one or more batteries extend across the battery housing, including the one or more apertures.

3. The electronic device of claim 1, wherein an intermediate layer extends between the one or more batteries and the one or more apertures, the intermediate layer extending beyond edges of the one or more apertures.

4. The electronic device of claim 3, wherein the intermediate layer comprises mylar.

5. The electronic device of claim 1, wherein an intermediate layer extends across the first plurality of magnets positioned within the one or more apertures.

6. The electronic device of claim 1, wherein each of the first plurality of magnets is grouped into pairs.

7. The electronic device of claim 1, further comprising:

a plurality of electrical contacts that are arranged to transfer electrical signals between the dock and the electronic device, when the electronic device is magnetically docked with the dock.

8. The electronic device of claim 7, wherein the plurality of electrical contacts comprises one or more pogo pins.

9. The electronic device of claim 1, wherein the battery housing is coupled to the enclosure using an adhesive.

10. The electronic device of claim 1, wherein the battery housing comprises one or more clips for managing cables internal to the enclosure.

11. The electronic device of claim 1, wherein the battery housing comprises one or more screw bosses for facilitating alignment of the battery housing.

12. A tablet computer system, comprising:

a dock;

a tablet computer which can be removably docked from the dock, the tablet computer comprising:

an electronic display;

an enclosure housing the electronic display;

one or more batteries that provide power to one or more components of the tablet computer;

a first plurality of magnets, wherein the first plurality of magnets is arranged to magnetically couple with a second plurality of magnets of the dock; and a battery housing that houses the one or more batteries, wherein:

the battery housing defines one or more apertures, the first plurality of magnets being positioned within the one or more apertures; and the battery housing includes an intermediate layer extending between the one or more batteries and the one or more apertures.

13. The tablet computer system of claim 12, wherein the one or more batteries extend across the battery housing, including the one or more apertures.

14. The tablet computer system of claim 12, wherein the intermediate layer comprises mylar.

15. The tablet computer system of claim 12, wherein the one or more batteries are coupled to the battery housing using an adhesive.

16. The tablet computer system of claim 12, wherein the battery housing comprises one or more clips for managing cables internal to the enclosure.

17. The tablet computer system of claim 12, wherein the battery housing comprises one or more screw bosses for facilitating alignment of the battery housing.

18. The tablet computer system of claim 12, wherein the battery housing is formed from a first portion and a second portion, the first portion and the second portion being separated by a central channel.

19. The tablet computer system of claim 18, further comprising a first set of electronic wires, wherein the central channel is configured to house the first set of electronic wires along a first side of the central channel.

20. The tablet computer system of claim 19, further comprising a second set of electronic wires associated with the electronic display, wherein the central channel is configured to house the second set of electronic wires along a second side of the central channel.

* * * * *